(12) United States Patent
Hirasawa et al.

(10) Patent No.: US 7,994,039 B2
(45) Date of Patent: Aug. 9, 2011

(54) METHOD OF FABRICATING SEMICONDUCTOR DEVICE

(75) Inventors: Shinichi Hirasawa, Tokyo (JP); Shinya Watanabe, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 106 days.

(21) Appl. No.: 12/399,140

(22) Filed: Mar. 6, 2009

(65) Prior Publication Data

US 2009/0280583 A1    Nov. 12, 2009

(30) Foreign Application Priority Data

May 12, 2008 (JP) ................. 2008-125006
Nov. 18, 2008 (JP) ................. 2008-294773

(51) Int. Cl.
*H01L 21/28* (2006.01)
(52) U.S. Cl. ............ 438/592; 438/664; 257/E21.199
(58) Field of Classification Search .......... 438/201, 438/211, 257, 592–593, 663–664; 257/E21.199
See application file for complete search history.

(56) References Cited

U.S. PATENT DOCUMENTS

| 2005/0224863 | A1 | 10/2005 | Hieda et al. | |
| 2006/0091436 | A1* | 5/2006 | Kim et al. | 257/295 |
| 2006/0278933 | A1 | 12/2006 | Endo | |
| 2007/0201275 | A1 | 8/2007 | Takeuchi et al. | |
| 2008/0054341 | A1 | 3/2008 | Natori et al. | |

FOREIGN PATENT DOCUMENTS

| JP | 2005-285818 | 10/2005 |
| JP | 2006-344809 | 12/2006 |
| JP | 2007-207947 | 8/2007 |
| JP | 2008-053295 | 3/2008 |
| KR | 2002-0002739 | 1/2002 |
| KR | 10-0432789 | 5/2004 |
| KR | 10-0638975 | 10/2006 |
| KR | 10-0796090 | 1/2008 |

OTHER PUBLICATIONS

Notification of Reasons for Rejection issued by the Korean Patent Office on Feb. 17, 2011, for Korean Patent Application No. 10-2009-40725, and English-language translation.

* cited by examiner

*Primary Examiner* — Thanhha Pham
(74) *Attorney, Agent, or Firm* — Finnegan, Henderson, Farabow, Garrett & Dunner, L.L.P.

(57) ABSTRACT

A method of fabricating a semiconductor device according to one embodiment includes: forming a plurality of Si-based pattern portions above a semiconductor substrate, the plurality of Si-based pattern portions being adjacent in a direction substantially parallel to a surface of the semiconductor substrate via insulating films; forming a metal film above the plurality of Si-based pattern portions and the insulating films so as to contact with the plurality of Si-based pattern portions; processing whole areas or upper portions of the plurality of Si-based pattern portions into a plurality of silicide layers by a silicidation reaction between the plurality of Si-based pattern portions and the metal film by heat treatment; and removing the plurality of silicide layers formed above the insulating films by applying planarizing treatment to the plurality of silicide layers.

5 Claims, 6 Drawing Sheets

METHOD OF FABRICATING SEMICONDUCTOR DEVICE

CROSS-REFERENCE TO RELATED APPLICATIONS

This application is based upon and claims the benefit of priority from prior Japanese Patent Application No. 2008-125006, filed on May 12, 2008 and No. 2008-294773, filed on Nov. 18, 2008, the entire contents of which are incorporated herein by reference.

BACKGROUND

There is a conventional method of fabricating a semiconductor device in which a metal silicide layer with low resistivity is formed by reacting an upper portion of polycrystalline silicon as a control gate of a flash memory with a metal film. This technique, for example, is disclosed in JP-A-2007-207947.

However, according to the conventional method, when a metal silicide layer is formed on a control gate, a silicidation reaction may proceed above an upper surface of an insulating film between control gates in a metal film. Above the upper surface of the insulating film between the control gates, the silicidation reaction proceeds not only in a vertical direction but also in a horizontal direction, thereby narrowing a distance between metal silicides of the adjacent control gates. Therefore, voltage endurance characteristics of an electrode structure may be deteriorated. Furthermore, as a result of the silicidation reaction proceeded in the horizontal direction, the metal silicides of the adjacent control gates may contact each other, thereby causing short circuit.

BRIEF SUMMARY

A method of fabricating a semiconductor device according to one embodiment includes: forming a plurality of Si-based pattern portions above a semiconductor substrate, the plurality of Si-based pattern portions being adjacent in a direction substantially parallel to a surface of the semiconductor substrate via insulating films; forming a metal film above the plurality of Si-based pattern portions and the insulating films so as to contact with the plurality of Si-based pattern portions; processing whole areas or upper portions of the plurality of Si-based pattern portions into a plurality of silicide layers by a silicidation reaction between the plurality of Si-based pattern portions and the metal film by heat treatment; and removing the plurality of silicide layers formed above the insulating films by applying planarizing treatment to the plurality of silicide layers.

A method of fabricating a semiconductor device according to another embodiment includes: forming a plurality of Si-based pattern portions above a semiconductor substrate, the plurality of Si-based pattern portions being adjacent in a direction substantially parallel to a surface of the semiconductor substrate via insulating films and heights of upper surfaces thereof being lower than those of the insulating films; forming a metal film above the plurality of Si-based pattern portions and the insulating films so as to be embedded in trenches, bottom surfaces of the trenches being upper surfaces of the plurality of Si-based pattern portions and inner side faces of the trenches being side faces of the insulating films exposed on both sides of the upper surfaces of the plurality of Si-based pattern portions; removing the metal film outside of the trenches by applying planarizing treatment to the metal film; and processing whole areas or upper portions of the plurality of Si-based pattern portions into a plurality of silicide layers by a silicidation reaction between the plurality of Si-based pattern portions and the metal film by heat treatment after applying the planarizing treatment to the metal film.

DETAILED DESCRIPTION

First Embodiment

A semiconductor device according to the present embodiment is a NAND-type flash memory provided with a control gate of a stacked gate composed of silicide.

Figure 1:
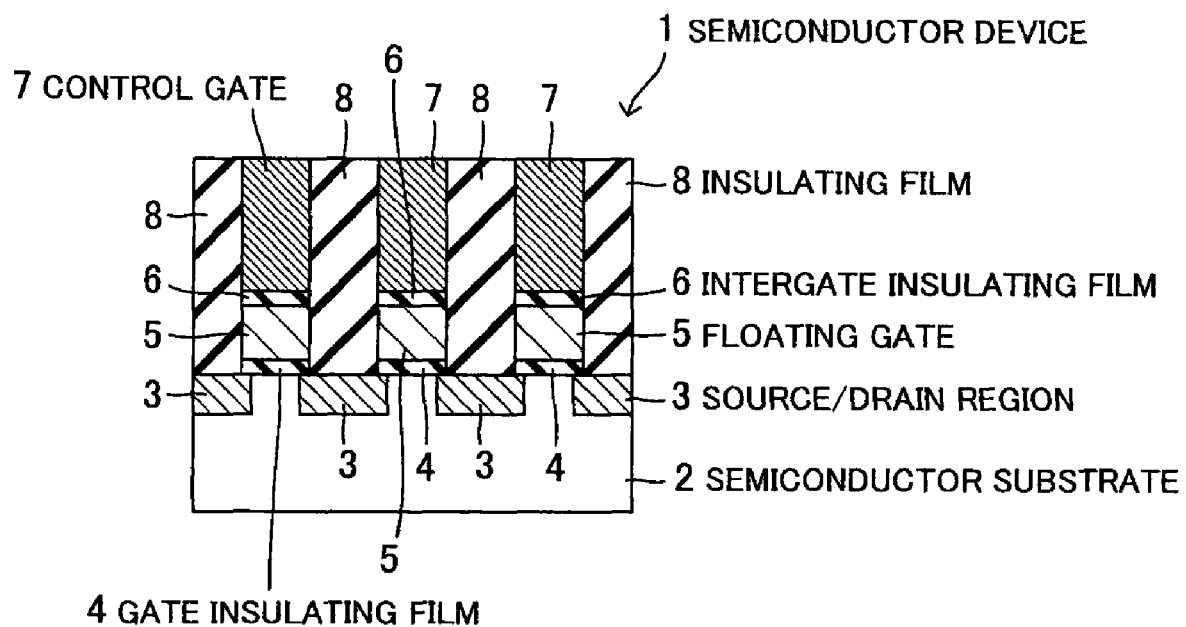
FIG. 1 is a cross sectional view showing a memory cell region of a semiconductor device according to a first embodiment.

FIG. 1 is a cross sectional view showing a memory cell region of a semiconductor device according to a first embodiment. A semiconductor device 1 is schematically configured to have a semiconductor substrate 2, source/drain regions 3 formed in the semiconductor substrate 2, floating gates 5 formed on the semiconductor substrate 2 via gate insulating films 4, control gates 7 formed on the floating gates 5 via intergate insulating films 6, and insulating films 8 formed between adjacent memory cells (a gap between plural laminated gate structures each composed by laminating the gate insulating film 4, the floating gate 5, the intergate insulating film 6 and the control gate 7 on the semiconductor substrate 2) sharing the source/drain region 3.

The semiconductor substrate 2 is made of a Si-based single crystal such as single crystal Si, etc.

The source/drain regions 3 are formed by, e.g., implanting a conductivity type impurity into a surface of the semiconductor substrate 2 using an ion implantation procedure. B, $BF_2$ or In, etc., can be used as a p-type impurity and As or P, etc., can be used as an n-type impurity.

The gate insulating film 4 and the insulating film 8 are made of an insulating material such as $SiO_2$, TEOS (Tetraethoxysilane), NSG (non-doped silicate glass) or BPSG (boron-doped phosphor silicate glass), etc.

The floating gate 5 is made of a Si-based material such as polycrystalline Si, etc. Furthermore, the floating gate 5 may contain an impurity such as P or B, etc.

The control gate 7 is made of silicide containing a metal such as Ni, Pt, Ti or Co, etc. In addition, the control gate 7 may have a structure of two layers in which an upper portion thereof is a silicide layer and a lower portion is a semiconductor layer made of a Si-based material such as polycrystalline Si, etc.

The intergate insulating film 6 has a single layer structure made of an insulating material such as $SiO_2$, ALD (Atomic Layer Deposition)-$SiO_2$, LP (Low-Pressure)-TEOS, AlO or HfAlO, etc., or a laminated structure including these insulating materials. Alternatively, the intergate insulating film 6 may be a film having a laminated structure such as an ONO film composed of three layers of $SiO_2$, SiN and $SiO_2$, an NONON film composed of five layers of SiN, $SiO_2$, SiN, $SiO_2$ and SiN, an OAO film composed of three layers of $SiO_2$, AlO and $SiO_2$, or an OHO film composed of three layers of $SiO_2$, HfAlO and $SiO_2$, etc.

FIGS. 2A to 2G are cross sectional views showing processes for fabricating the semiconductor device according to the first embodiment.

Figure 2A:
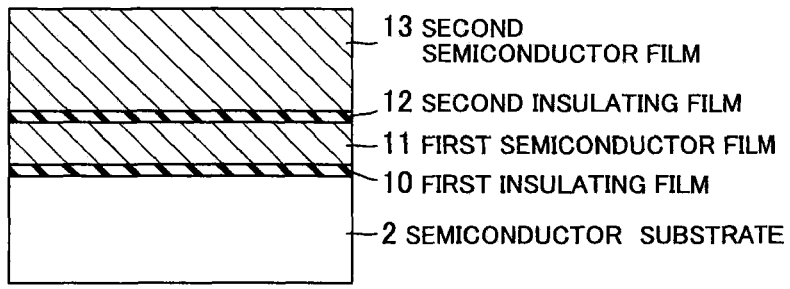
FIGS. 2A to 2G are cross sectional views showing processes for fabricating the semiconductor device according to the first embodiment.

Firstly, as shown in FIG. 2A, a first insulating film 10, a first semiconductor film 11, a second insulating film 12 and a second semiconductor film 13 are laminated on the semiconductor substrate 2.

In detail, firstly, the first insulating film 10 and the first semiconductor film 11 are laminated on the semiconductor substrate 2. Next, although it is not shown in a cross section of FIG. 2A, a trench is formed by patterning the first semiconductor film 11, the first insulating film 10 and a surface portion of the semiconductor substrate 2, and then, an element isolation region is formed in the trench. Next, the second insulating film 12 and the second semiconductor film 13 are laminated on the first semiconductor film 11 and the element isolation region.

Here, the first semiconductor film 11 and the second semiconductor film 13 are made of a Si-based material such as polycrystalline Si, etc. In addition, the Si-based material may contain an impurity such as P or B, etc. The first insulating film 10 and the second insulating film 12 are formed by a CVD (Chemical Vapor Deposition) method or a LPCVD (Low-Pressure CVD) method, etc. The first semiconductor film 11 and the second semiconductor film 13 are formed by the LPCVD method, etc.

Figure 2B:
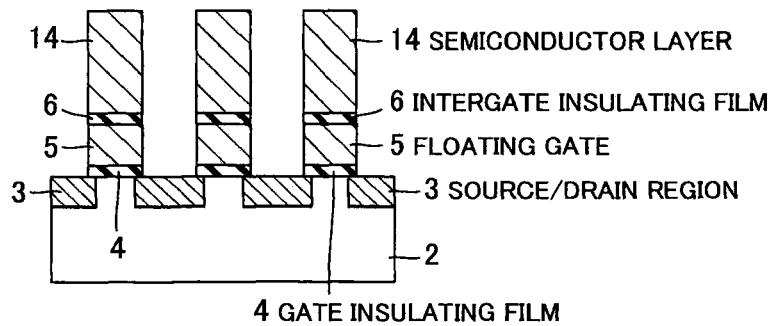

Next, as shown in FIG. 2B, semiconductor layers (Si-based pattern portions) 14, the intergate insulating films 6, the floating gates 5, the gate insulating films 4 and the source/drain regions 3 are formed.

Here, the semiconductor layers (Si-based pattern portions) 14, the intergate insulating films 6, the floating gates 5 and the gate insulating films 4 are formed by patterning the second semiconductor film 13, the second insulating film 12, the first semiconductor film 11 and the first insulating film 10 using a photolithography method and a RIE (Reactive Ion Etching) method, etc.

In addition, after the semiconductor layers 14, the intergate insulating films 6, the floating gates 5 and the gate insulating films 4 are formed, an conductivity type impurity is implanted by an ion implantation procedure, etc., into the surface of the semiconductor substrate 2 exposed by self-alignment with the obtained laminated structure and the implanted impurity is activated by heat treatment, which results in that the source/drain regions 3 is formed.

Figure 2C:
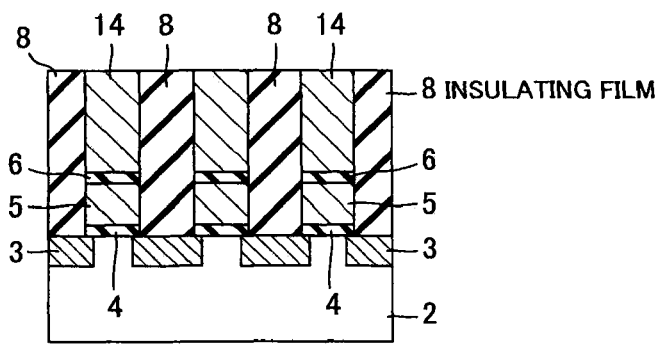

Next, as shown in FIG. 2C, the insulating film 8 is formed between the memory cells. Here, after depositing an insulating film by the CVD method, etc., so as to fill gaps between the memory cells, the deposited insulating film is etched back by the RIE method, etc., until upper surfaces of the semiconductor layers 14 are exposed, thereby forming the insulating films 8. Alternatively, planarizing treatment by CMP (Chemical Mechanical Polishing), etc., may be applied to the deposited insulating film instead of applying the etching.

Figure 2D:
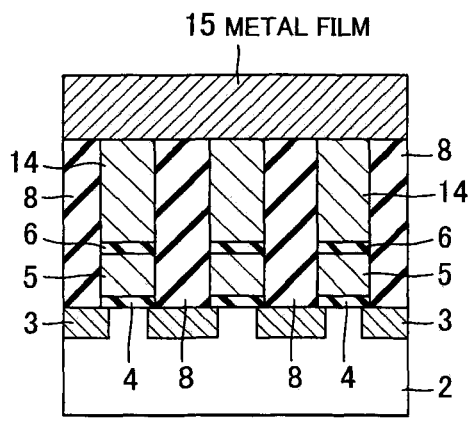

Next, as shown in FIG. 2D, a metal film 15 is formed on the semiconductor layers 14 and the insulating films 8. Here, the metal film 15 is made of a metal such as Ni, Pt, Ti or Co, etc., or an alloy containing theses metals. The metal film 15 is formed by a PVD (Physical Vapor Deposition) method or a sputtering method, etc. In addition, a thickness of the metal film 15 is determined depending on a thickness of the semiconductor layers 14. The semiconductor layers 14 and the metal film 15 are formed in a thickness appropriately corresponding to each other within a range of, e.g., 20-170 nm for the semiconductor layers 14 and 5-100 nm for the metal film 15.

Figure 2E:
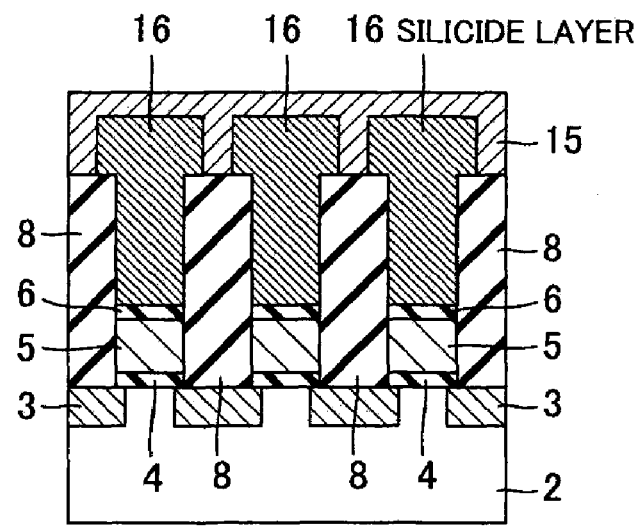

Next, as shown in FIG. 2E, silicide layers 16 are formed by the silicidation reaction between the semiconductor layers 14 and the metal film 15 by applying first heat treatment. Here, the heat treatment is carried out using, e.g., an RTA (Rapid Thermal Annealing) method under a condition at 350° C. for 60 seconds.

Note that, in this process, the entire semiconductor layers 14 may be silicided, or alternatively, an upper portion of the semiconductor layers 14 may be silicided.

Figure 2F:
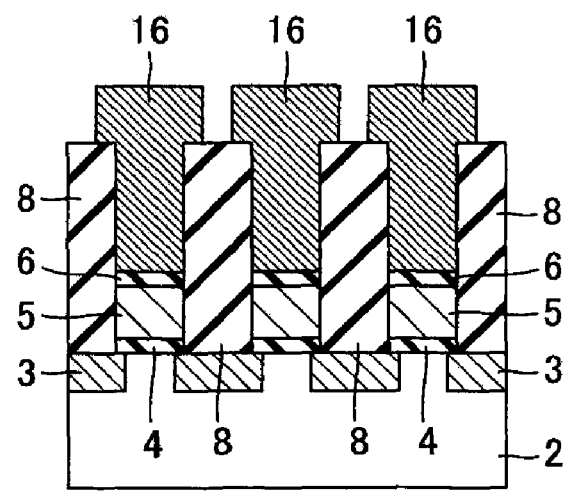

Next, as shown in FIG. 2F, the unreacted metal film 15 is selectively removed. Here, the unreacted metal film 15 is removed by wet etching, e.g., using a mixed chemical of sulfuric acid and hydrogen peroxide, etc.

Then, after removing the unreacted metal film 15, a composition of the silicide layers 16 is stabilized by carrying out second heat treatment. The heat treatment here is carried out at a temperature higher than that of the first heat treatment shown in FIG. 2E. The heat treatment is carried out under the condition at, e.g., 500° C. for 60 seconds using the RTA method.

Figure 2G:
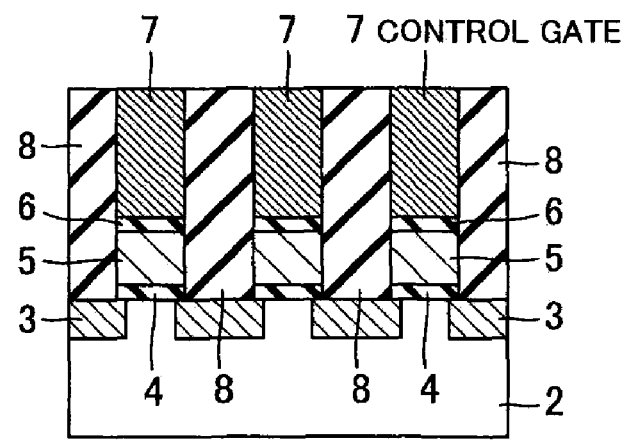

Next, as shown in FIG. 2G, the planarizing treatment by the CMP method, etc., is applied to the silicide layers 16, the silicide layers 16 formed on the insulating films 8 is removed, and thus, the height of the upper surfaces of the silicide layers 16 is substantially equalized to that of the insulating films 8 by removing. As a result, the silicide layers 16 are processed into the control gates 7.

Note that, when the upper portions of the semiconductor layers 14 are silicided in the process shown in FIG. 2E, each of the control gates 7 has a structure of two layers composed of the semiconductor layer 14 and the silicide layer 16 on the semiconductor layer 14.

Alternatively, instead of the first heat treatment in the present embodiment, the RTA may be carried out under processing conditions of a processing temperature higher than 350° C. but lower than 450° C. and a processing time longer than 60 seconds. In this case, it is not necessary to carry out the second heat treatment of the embodiment. Here, when the processing temperature is 350° C. or less or when the processing time is 60 seconds or less, the silicidation reaction between the semiconductor layers 14 and the metal film 15 becomes insufficient, and electrical resistivity of the control gate 7 may be increased. Meanwhile, when the processing temperature is 450° C. or more, a layer with a particularly high percentage of metal is formed, and this layer may be removed together when the unreacted metal film 15 is removed.

The following shows results of an experiment for verifying whether or not it is possible to accurately carry out the process of applying the planarizing treatment by the CMP method, etc., to the silicide layers 16 and substantially equalizing the height of the upper surface thereof to that of the insulating films 8, which is shown in FIG. 2G.

In this experiment, a Ni silicide layer was used as the silicide layers 16, a TEOS film was used as the insulating films 8, and the planarizing treatment by the CMP method was carried out. In addition, each condition of the planarizing treatment was a polishing pressure of 250 hPa, a wafer rotational speed of 81 rpm, a table rotational speed of 80 rpm and a slurry flow rate of 200 cc/min.

The following Table 1 shows an elapsed time from the start of the CMP process and a polishing amount of the Ni silicide and the TEOS at each time point evaluated by measurement using a film thickness gauge. In addition, "selectivity" in Table 1 is a polishing selectivity of the Ni silicide to the TEOS, which is a value that the polishing amount of the Ni silicide is divided by the polishing amount of the TEOS.

TABLE 1

| Elapsed time [s] | Polishing amount of Ni silicide [nm] | Polishing amount of TEOS [nm] | Selectivity |
| --- | --- | --- | --- |
| 30 | 35 | 0.58 | 60.3 |
| 40 | 65 | 0.7 | 92.8 |
| 60 | 69 | 0.6 | 115 |
| 120 | 128 | 63 | 2.03 |

At the elapsed time of 120 s, the planarizing treatment directly reached the TEOS film and the polishing amount of the TEOS is large. On the other hand, at each elapsed time of 30 s, 40 s and 60 s, the planarizing treatment did not directly reach the TEOS film and a sufficiently large selectivity was obtained.

The above experimental result shows that, if planarizing treatment is stopped at a timing that the height of the upper surface of the Ni silicide layer becomes substantially equal to that of the TEOS film by appropriately controlling the processing time, it is possible to process the Ni silicide layer into the control gate 7 almost without polishing the TEOS film. As a result, it was confirmed that it is possible to implement the present embodiment by appropriately combining a material of the silicide layer 16 (the semiconductor layer 14 and the metal film 15) with a material of the insulating film 8.

According to the first embodiment, by removing portions of the silicide layers 16 extending in a horizontal direction above the upper surfaces of the insulating films 8 by the planarizing treatment, it is possible to prevent the gap between the adjacent silicide layers 16 (the control gates 7) from being narrowed, and to suppress deterioration of the voltage endurance characteristics between the control gates 7 and generation of the short circuit between the control gates 7.

Second Embodiment

The second embodiment is different from the first embodiment in that, after forming the silicide layers 16, the planarizing treatment is applied to the silicide layers 16 without removing the unreacted metal film 15. Note that, the explanation will be omitted or simplified for the points same as the first embodiment.

Figure 3A:
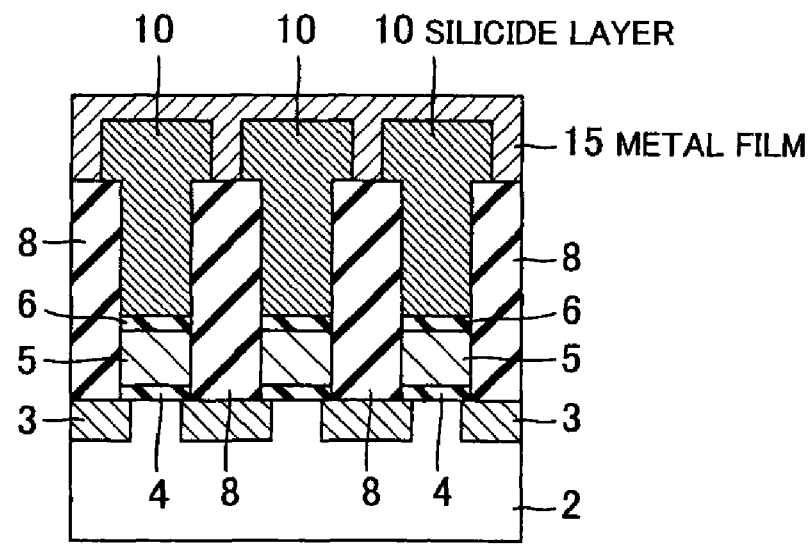
FIGS. 3A and 3B are cross sectional views showing processes for fabricating a semiconductor device according to a second embodiment.
Figure 3B:
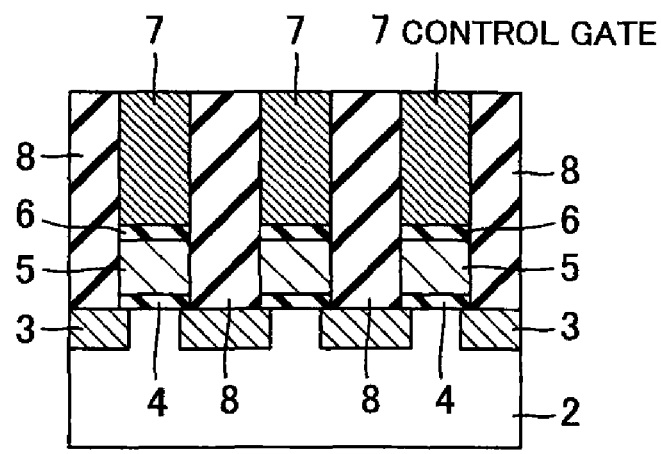

FIGS. 3A and 3B are cross sectional views showing processes for fabricating a semiconductor device according to the second embodiment.

Firstly, as shown in FIG. 3A, the processes until the process, shown in FIGS. 2A to 2E, for forming the silicide layer 16 by applying the first heat treatment are carried out in the same way as the first embodiment.

Next, as shown in FIG. 3B, the planarizing treatment by the CMP method, etc., is applied to the unreacted metal film 15 and the silicide layers 16, and the height of the upper surfaces of the silicide layers 16 is substantially equalized to that of the insulating films 8. As a result, the silicide layers 16 are processed into the control gates 7. At this time, most of the unreacted metal film 15 on the insulating films 8 is removed together with the silicide layers 16 formed on the insulating films 8 by the planarizing treatment.

Here, when the planarizing treatment is carried out, it is preferable to detect the endpoint of the process using an ECM (Eddy Current Monitor), etc. The endpoint detection method using the ECM will be explained as follows.

The ECM makes magnetic flux pass through a conductor section of a test object, generates an eddy current by electromagnetic induction, and detects a magnitude of the eddy current by a sensor. Since the magnitude of the generated eddy current correlates with a thickness of the conductor section, it is possible to evaluate variation of the thickness of the conductor section by measuring variation of the magnitude of the eddy current.

In the present embodiment, when a film thickness of the metal film 15 (and the silicide layers 16) as the conductor section is decreased by the planarizing treatment, the magnitude of the eddy current generated in the semiconductor device 1 is decreased. When the metal film 15 is nearly completely removed by further continuing the planarizing treatment and the upper surfaces of the insulating films 8 is exposed, a rate of decrease in the magnitude of the eddy current drastically slows down. Therefore, by monitoring the variation of the magnitude of the eddy current using the ECM, it is possible to detect an accurate timing that the height of the upper surfaces of the silicide layers 16 becomes substantially equal to that of the insulating films 8 (the endpoint of the planarizing treatment).

Note that, when the planarizing treatment is applied to the silicide layers 16 after removing the unreacted metal film 15 similarly to the first embodiment, it is difficult to detect the endpoint by the ECM. This is because, the timing that the height of the upper surfaces of the silicide layers 16 becomes substantially equal to that of the insulating films 8 is difficult to be detected from the variation of the magnitude of the eddy current which is generated only in the silicide layers 16.

Subsequently, the unreacted metal film 15 that could not be removed by the planarizing treatment is selectively removed. Here, the unreacted metal film 15 is removed by wet etching, e.g., using a mixed chemical of sulfuric acid and hydrogen peroxide, etc. Note that, when the unreacted metal film 15 on the insulating films 8 is sufficiently removed by the planarizing treatment, it is possible to omit this process.

Then, compositions of the silicide layers 16 are stabilized by applying the second heat treatment to the silicide layers 16 that were processed into the control gates 7. The heat treatment here is carried out at a temperature higher than that of the first heat treatment shown in FIG. 2E. The heat treatment is carried out under the condition at, e.g., 500° C. for 60 seconds using the RTA method.

Note that, when the RTA is carried out under processing conditions of a processing temperature higher than 350° C. but lower than 450° C. and a processing time longer than 60 seconds instead of carrying out the first heat treatment in the present embodiment, it is not necessary to carry out the second heat treatment.

According to the second embodiment, by applying the planarizing treatment to the unreacted metal film 15 and the silicide layers 16 while monitoring the magnitude of the eddy current generated in the semiconductor device 1, it is possible to detect the accurate timing that the height of the upper surfaces of the silicide layers 16 becomes substantially equal to that of the insulating films 8.

Third Embodiment

The third embodiment is different from the first embodiment in a process sequence of the planarizing treatment by the CMP method, etc., and the silicidation reaction between the metal film 15 and the semiconductor layers 14, etc. Note that, the explanation will be omitted or simplified for the points same as the first embodiment.

FIGS. 4A to 4D are cross sectional views showing processes for fabricating a semiconductor device according to the third embodiment.

Firstly, the processes until the process, shown in FIGS. 2A to 2C, for forming the insulating films 8 between the memory cells are carried out in the same way as the first embodiment.

Figure 4A:
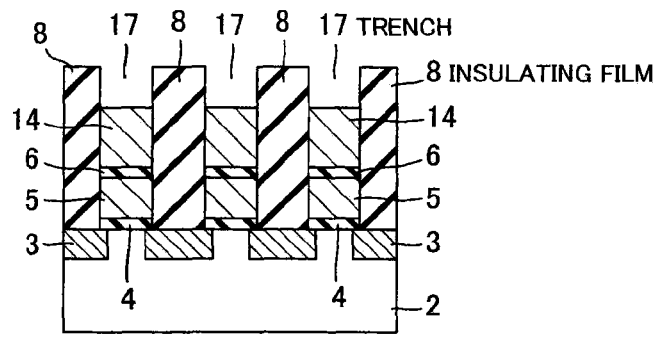
FIGS. 4A to 4D are cross sectional views showing processes for fabricating a semiconductor device according to a third embodiment.

Next, as shown in FIG. 4A, a height of the upper surfaces of the semiconductor layers 14 is lowered by etching such as the RIE method, etc., which results in that trenches 17 are formed. Bottom surfaces of the trenches 17 are the upper surfaces of the semiconductor layers 14, and inner side faces of the trenches 17 are side faces of the insulating films 8 exposed on both sides of the upper surfaces of the semiconductor layers 14. Here, a ratio of the height of the semiconductor layers 14 after etching to the height of the semiconductor layers 14 before etching (a sum of the height of the semiconductor layers 14 after etching and the height of the trenches 17) is preferably not less than 50%, nor more than 80%.

When the ratio is less than 50%, since an aspect ratio (depth:width) of the trenches 17 becomes too large, an embedding property of the metal film 15 in the trenches 17 in a posterior process may be deteriorated. Meanwhile, when the ratio is more than 80%, since depths of the trenches 17 become too shallow, volume of the metal film 15 that is embedded in trenches 17 in a posterior process is decreased, which may be insufficient to silicide the semiconductor layers 14.

Note that, in order to embed sufficient volume of the metal film 15 in the trenches 17 while ensuring the embedding property of metal film 15 in the trenches 17, in particular, the ratio is preferably not less than 60%, nor more than 70%.

Figure 4B:
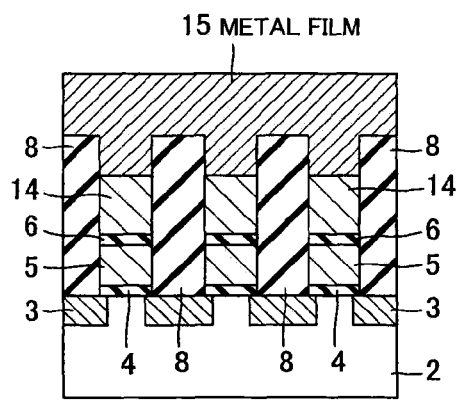

Next, as shown in FIG. 4B, the metal film 15 is deposited and embedded in the trenches 17 by the sputtering method, etc.

Figure 4C:
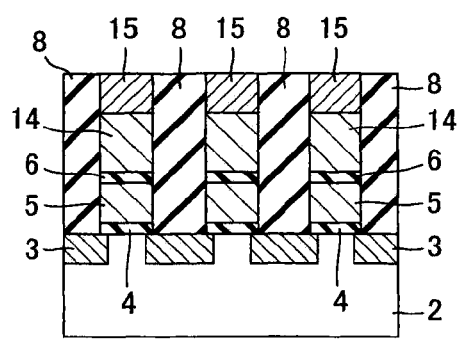

Next, as shown in FIG. 4C, the metal film 15 outside the trenches 17 is removed by the CMP method, etc. Here, it is possible to enhance polishing efficiency by polishing the metal film 15 while oxidizing the metal film 15 by adding an oxidant such as hydrogen peroxide solution, etc., to CMP slurry.

Figure 4D:
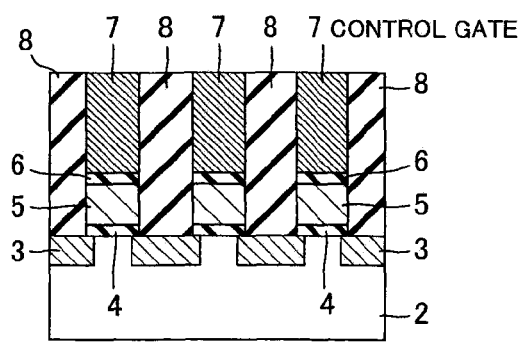

Next, as shown in FIG. 4D, the control gates 7 made of silicide are formed by the silicidation reaction between the semiconductor layers 14 and the metal film 15 by applying heat treatment. Subsequently, the unreacted metal film 15 is removed by wet etching, e.g., using a mixed chemical of sulfuric acid and hydrogen peroxide, etc.

Here, the heat treatment is carried out under processing conditions of, e.g., a processing temperature higher than 350° C. but lower than 450° C. and a processing time longer than 60 seconds using the RTA method. When the processing temperature is 350° C. or less or when the processing time is 60 seconds or less, the silicidation reaction between the semiconductor layers 14 and the metal film 15 becomes insufficient, and electrical resistivity of the control gates 7 may be increased. Meanwhile, when the processing temperature is 450° C. or more, a layer with a particularly high percentage of metal is formed, and this layer may be removed together when the unreacted metal film 15 is removed.

According to the third embodiment, it is possible to form the semiconductor device 1 equivalent to that of the first embodiment through processes different from that of the first embodiment.

Fourth Embodiment

The fourth embodiment is different from the third embodiment in a method of forming the trenches 17. Note that, the explanation will be omitted or simplified for the points same as the third embodiment.

FIGS. 5A to 5D are cross sectional views showing processes for fabricating a semiconductor device according to the fourth embodiment.

Figure 5A:
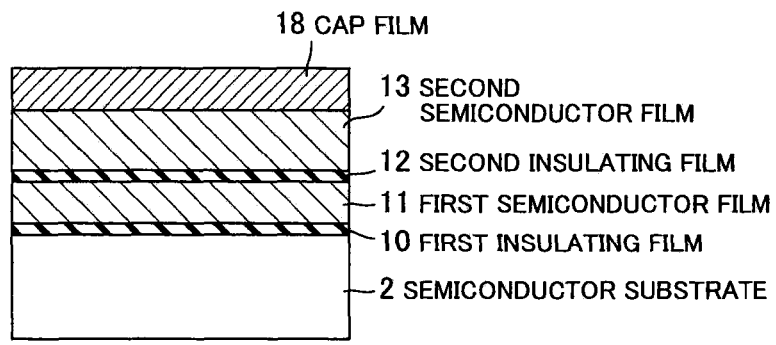
FIGS. 5A to 5D are cross sectional views showing processes for fabricating a semiconductor device according to a fourth embodiment.

Firstly, as shown in FIG. 5A, the first insulating film 10, the first semiconductor film 11, the second insulating film 12, the second semiconductor film 13 and a cap film 18 are laminated on the semiconductor substrate 2. Here, the cap film 18 is made of a material such as SiN, etc., which can ensure an etching selectivity with respect to the insulating film 8, and is formed by the CVD method, etc.

In detail, firstly, the first insulating film 10 and the first semiconductor film 11 are laminated on the semiconductor substrate 2. Next, although it is not shown in a cross section of FIG. 5A, a trench is formed by patterning the first semiconductor film 11, the first insulating film 10 and a surface portion of the semiconductor substrate 2, and then, an element isolation region is formed in the trench. Next, the second insulating film 12, the second semiconductor film 13 and the cap film 18 are laminated on the first semiconductor film 11 and the element isolation region.

Figure 5B:
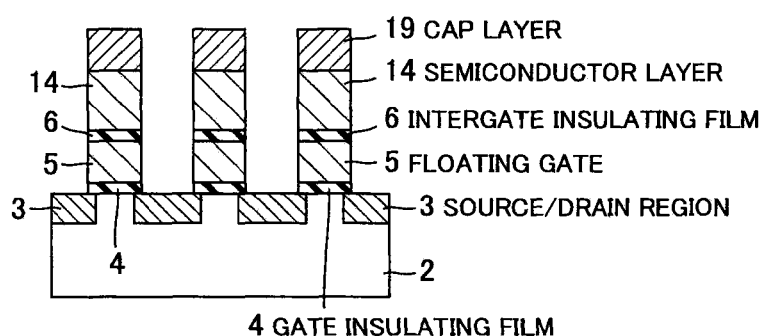

Next, as shown in FIG. 5B, cap layers 19, the semiconductor layers 14, the intergate insulating films 6, the floating gates 5, the gate insulating films 4 and the source/drain regions 3 are formed.

Here, the cap layers 19, the semiconductor layers 14, the intergate insulating films 6, the floating gates 5 and the gate insulating films 4 are formed by patterning the cap layer 18, the second semiconductor film 13, the second insulating film 12, the first semiconductor film 11 and the first insulating film 10 using the photolithography method and the RIE method, etc.

Figure 5C:
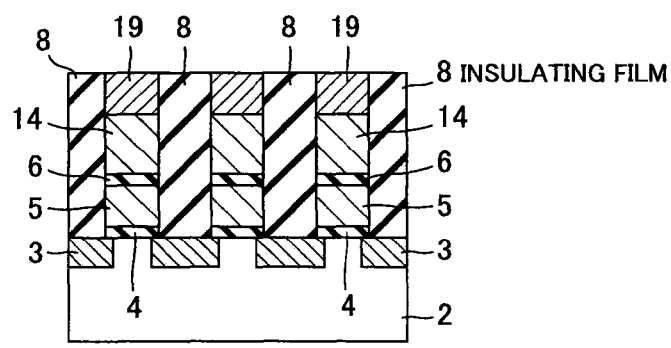

Next, as shown in FIG. 5C, the insulating films 8 are formed between the memory cells. Here, after depositing an insulating film by the CVD method, etc., so as to fill gaps between the memory cells, the deposited insulating film is etched back by the RIE method, etc., until an upper surface of the cap layers 19 is exposed, thereby forming the insulating films 8. Alternatively, the planarizing treatment by CMP, etc., may be applied to the deposited insulating film instead of applying the etching.

In addition, at this stage, a ratio of the height of the semiconductor layers 14 to the sum of the height of the semiconductor layers 14 and the height of the cap layers 19 is preferably not less than 50%, nor more than 80%. This is because, similarly to the third embodiment, the ratio of the height of the semiconductor layers 14 to the sum of the height of the semiconductor layers 14 and the height of the trenches 17 is adjusted to not less than 50%, nor more than 80% in a posterior process. In addition, similarly to the third embodiment, the ratio is preferably not less than 60%, nor more than 70%.

Figure 5D:
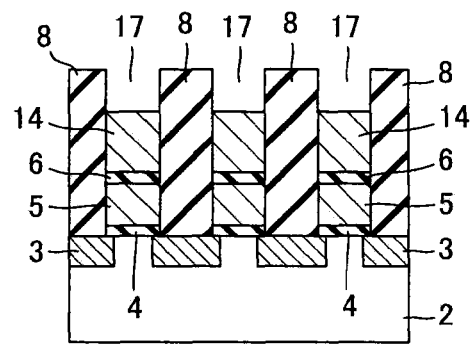

Next, as shown in FIG. 5D, the cap layers 19 is selectively removed by etching, which results in that the trenches 17 is formed.

Subsequently, the processes after the process, shown in FIG. 4B, for depositing the metal film 15 are carried out in the same way as the third embodiment, thereby forming the semiconductor device 1.

According to the fourth embodiment, similarly to the third embodiment, it is possible to form the semiconductor device 1 equivalent to that of the first embodiment through processes different from that of the first embodiment.

Other Embodiments

It should be noted that the present invention is not intended to be limited to the above-mentioned first to fourth embodiments, and the various kinds of changes thereof can be implemented by those skilled in the art without departing from the gist of the invention.

For example, in each of the above-mentioned first to fourth embodiments, although the fabrication method of a floating gate type flash memory having a laminated gate structure is shown as an example, the similar effect is obtained in a fabrication method of a flash memory having a single layer gate structure such as a MONOS type flash memory. Namely, a metal silicide may be formed as a control gate of the MONOS type flash memory by the method of each of the above-mentioned first to fourth embodiments, and it is possible to apply each of the above-mentioned first to fourth embodiments to a gate of a transistor in other logic devices.

Furthermore, the similar effect is obtained in a fabrication method of a plug for electrically connecting upper and lower conductive members. Namely, a plug, which has a metal silicide layer at least on an upper portion thereof and is made of a Si-based material, can be formed by the method of each of the above-mentioned first to fourth embodiments.

Furthermore, it is possible to arbitrarily combine the configurations of the above-mentioned first to fourth embodiments without departing from the gist of the invention. For example, in the first and second embodiments, the metal film 15 for silicidation may be deposited on the upper surfaces of the semiconductor layers 14 and the insulating films 8 after forming a trench by lowering the height of the upper surface of the semiconductor layers 14. Alternatively, in the third and fourth embodiments, the endpoint of the planarizing treatment may be detected using the ECM.

What is claimed is:

1. A method of fabricating a semiconductor device, comprising:

forming a plurality of Si-based pattern portions above a semiconductor substrate, the plurality of Si-based pattern portions being adjacent in a direction substantially parallel to a surface of the semiconductor substrate via insulating films;

forming a metal film above the plurality of Si-based pattern portions and the insulating films so as to contact with the plurality of Si-based pattern portions;

processing whole areas or upper portions of the plurality of Si-based pattern portions into a plurality of silicide layers by a silicidation reaction between the plurality of Si-based pattern portions and the metal film by a first heat treatment;

removing the plurality of silicide layers formed above the insulating films by applying planarizing treatment to the plurality of silicide layers;

removing an unreacted portion of the metal film after applying the planarizing treatment to the plurality of silicide layers; and applying a second heat treatment to the plurality of silicide layers under a temperature condition higher than the first heat treatment, after removing the unreacted portion of the metal film.

2. The method of fabricating a semiconductor device according to claim 1, wherein an endpoint of the planarizing treatment is detected using an ECM.

3. The method of fabricating a semiconductor device according to claim 1, wherein each of the plurality of silicide layers is a control gate of a stacked gate.

4. The method of fabricating a semiconductor device according to claim 1, wherein the metal film comprises at least one of Ni, Pt, Ti and Co.

5. The method of fabricating a semiconductor device according to claim 1, wherein the first heat treatment is carried out under a temperature condition higher than 350° C. and lower than 450° C.

* * * * *